(12) United States Patent  
Noguchi

(10) Patent No.: US 12,506,461 B2  
(45) Date of Patent: Dec. 23, 2025

(54) ACOUSTIC WAVE DEVICE

(71) Applicant: Murata Manufacturing Co., Ltd., Nagaokakyo (JP)

(72) Inventor: Akira Noguchi, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 161 days.

(21) Appl. No.: 18/584,603

(22) Filed: Feb. 22, 2024

(65) Prior Publication Data

US 2024/0195383 A1  Jun. 13, 2024

Related U.S. Application Data

(63) Continuation of application No. PCT/JP2022/032805, filed on Aug. 31, 2022.

(30) Foreign Application Priority Data

Sep. 8, 2021  (JP) .................................. 2021-146311

(51) Int. Cl.
*H03H 9/05* (2006.01)
*H03H 9/10* (2006.01)
(Continued)

(52) U.S. Cl.
CPC .......... *H03H 9/0576* (2013.01); *H03H 9/059* (2013.01); *H03H 9/1085* (2013.01); *H03H 9/6483* (2013.01); *H03H 9/725* (2013.01)

(58) Field of Classification Search
CPC .......... H03H 9/0576; H03H 9/25; H03H 9/64; H03H 9/725; H03H 9/6483; H03H 9/72; H03H 9/1085; H03H 9/059
See application file for complete search history.

(56) References Cited

U.S. PATENT DOCUMENTS 5,859,473 A  1/1999  Ikata et al.
8,283,997 B2 * 10/2012  Fujita .................. H03H 9/0571
                                                                 333/195

(Continued)

FOREIGN PATENT DOCUMENTS

JP  H06350307 A  12/1994
JP  H10126213 A   5/1998
(Continued)

OTHER PUBLICATIONS

International Search Report in PCT/JP2022/032805, mailed Dec. 6, 2022, 3 pages.

(Continued)

*Primary Examiner* — Quan Tra
*Assistant Examiner* — Anh-Quan Tra
(74) *Attorney, Agent, or Firm* — Keating & Bennett, LLP

(57) ABSTRACT

An acoustic wave device includes a mounting substrate including a multilayer body that includes a first layer including first and second signal wiring lines at least partially facing each other, and a second layer including a ground electrode, and an acoustic wave filter on the mounting substrate and electrically connected to the first signal wiring line, the second signal wiring line, and the ground electrode. The ground electrode overlaps the first and second signal wiring lines, and a region between the first and second signal wiring lines in plan view. A portion of the second layer overlapping the inter-wiring-line region in plan view includes a ground electrode missing portion.

19 Claims, 12 Drawing Sheets

(51) Int. Cl.
*H03H 9/64* (2006.01)
*H03H 9/72* (2006.01)

(56) References Cited

U.S. PATENT DOCUMENTS

| | | | |
|---|---|---|---|
| 2006/0012421 | A1 | 1/2006 | Yamaguchi et al. |
| 2008/0290963 | A1 | 11/2008 | Kim |
| 2015/0216033 | A1* | 7/2015 | Kitajima ............. H05K 1/0243 333/238 |
| 2018/0083600 | A1 | 3/2018 | Noguchi |
| 2024/0022232 | A1* | 1/2024 | Kato ....................... H04B 1/38 |

FOREIGN PATENT DOCUMENTS

| | | | |
|---|---|---|---|
| JP | 2003218473 A | 7/2003 |
| JP | 2003298462 A | 10/2003 |
| JP | 2009515458 A | 4/2009 |
| JP | 2013081118 A | 5/2013 |
| JP | 2018050108 A | 3/2018 |

OTHER PUBLICATIONS

Written Opinion in PCT/JP2022/032805, mailed Dec. 6, 2022, 4 pages.

* cited by examiner

ACOUSTIC WAVE DEVICE

CROSS REFERENCE TO RELATED APPLICATIONS

This application claims the benefit of priority to Japanese Patent Application No. 2021-146311 filed on Sep. 8, 2021 and is a Continuation Application of PCT Application No. PCT/JP2022/032805 filed on Aug. 31, 2022. The entire contents of each application are hereby incorporated herein by reference.

BACKGROUND OF THE INVENTION

1. Field of the Invention

The present invention relates to acoustic wave devices each including an acoustic wave filter mounted on a mounting substrate.

2. Description of the Related Art

In the past, acoustic wave devices have been widely used as filters for cellular phones, and the like. Japanese Unexamined Patent Application Publication No. 6-350307 discloses an example of a duplexer as an acoustic wave device. In this duplexer, a surface acoustic wave (SAW) filter is used as a reception filter. An inductor of a low pass filter is disposed on a transmission path between the SAW filter and an antenna terminal. The low pass filter is used as a phase matching circuit. The SAW filter and the low pass filter are housed in a single housing.

In general, a mounting substrate on which a duplexer is mounted has a ground electrode. The ground electrode is connected to a ground potential. Then, in the mounting substrate, an area of the ground electrode is preferably as large as possible in order to reduce impedance of the ground electrode. However, when a duplexer as described in Japanese Unexamined Patent Application Publication No. 6-350307 is mounted on a mounting substrate having a ground electrode with a large area, it is difficult to sufficiently improve isolation characteristics.

SUMMARY OF THE INVENTION

Example embodiments of the present invention provide acoustic wave devices in each of which isolation characteristics are improved.

An acoustic wave device according to an example embodiment of the present invention includes a mounting substrate including a multilayer body that includes a first layer including a first signal wiring line and a second signal wiring line at least partially facing each other, and a second layer including a ground electrode, and an acoustic wave filter on the mounting substrate, and electrically connected to the first signal wiring line, the second signal wiring line and the ground electrode, in which the ground electrode overlaps the first signal wiring line and the second signal wiring line, and a region between the first signal wiring line and the second signal wiring line in a plan view, and a portion of the second layer overlapping the region between the first signal wiring line and the second signal wiring line in the plan view includes a ground electrode missing portion.

With acoustic wave devices according to example embodiments of the present invention, isolation characteristics are improved.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Hereinafter, the present invention will be clarified by explaining example embodiments of the present invention and modifications thereof with reference to the accompanying drawings.

Each example embodiment described in the present specification is merely an example, and partial replacement or combination of configurations is possible between different example embodiments.

Figure 1:
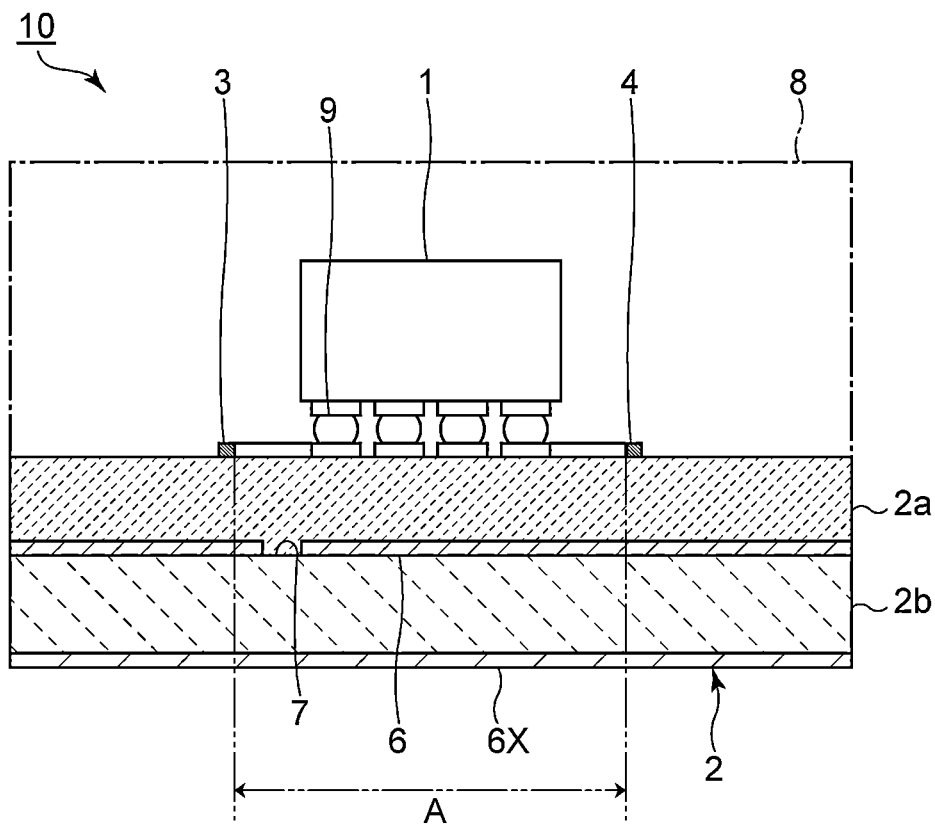
FIG. 1 is a schematic elevational cross-sectional view of an acoustic wave device according to a first example embodiment of the present invention.
Figure 2:
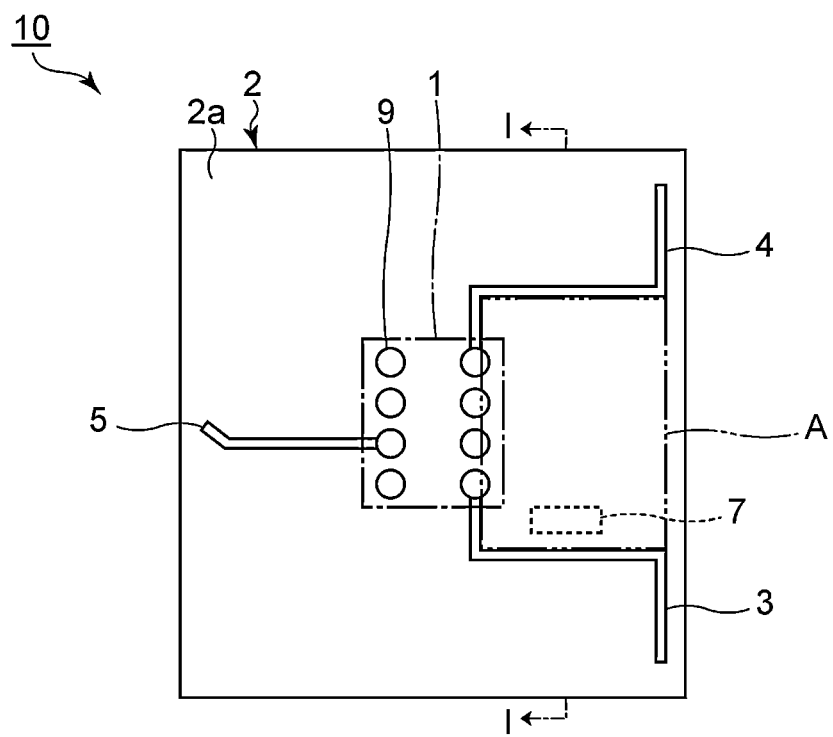
FIG. 2 is a schematic plan view of the acoustic wave device according to the first example embodiment of the present invention.

FIG. 1 is a schematic elevational cross-sectional view of an acoustic wave device according to a first example embodiment of the present invention. FIG. 2 is a schematic plan view of the acoustic wave device according to the first example embodiment. Note that FIG. 1 is a cross-sectional view taken along a line I-I of FIG. 2. In FIG. 2, a sealing resin described later is omitted. The same applies to the other plan views.

As illustrated in FIG. 1, an acoustic wave device 10 includes an acoustic wave filter 1 and a mounting substrate 2. In the present example embodiment, the acoustic wave filter 1 is, for example, a duplexer. The acoustic wave filter 1 includes a common connection terminal, a transmission filter and a reception filter. The transmission filter and the reception filter are connected in common to the common connection terminal.

The acoustic wave filter 1 is provided on the mounting substrate 2. More specifically, the acoustic wave filter 1 is bonded to the mounting substrate 2 by, for example, a plurality of bumps 9. However, the acoustic wave filter 1 may be bonded to the mounting substrate 2 by, for example, a conductive bonding member other than the bump 9. A sealing resin 8 is provided on the mounting substrate 2 so as to cover the acoustic wave filter 1. In FIG. 1, the sealing resin 8 is indicated by a dash-dot line.

The mounting substrate 2 is a multilayer body. The mounting substrate 2 includes a first layer 2a and a second layer 2b. The first layer 2a is provided on the second layer 2b. The acoustic wave filter 1 is provided on the first layer 2a.

As illustrated in FIG. 2, the first layer 2a includes a first signal wiring line 3, a second signal wiring line 4, and a third signal wiring line 5. In the present example embodiment, the first signal wiring line 3 and the second signal wiring line 4 are, for example, micro split lines. The first signal wiring line 3 is electrically connected to the reception filter in the acoustic wave filter 1. The second signal wiring line 4 is electrically connected to the transmission filter in the acoustic wave filter 1. One end of the third signal wiring line 5 is electrically connected to the common connection terminal in the acoustic wave filter 1. In the present example embodiment, the other end of the third signal wiring line 5 is connected to an antenna. The first signal wiring line 3 may be electrically connected to the transmission filter, and the second signal wiring line 4 may be electrically connected to the reception filter.

Figure 3:
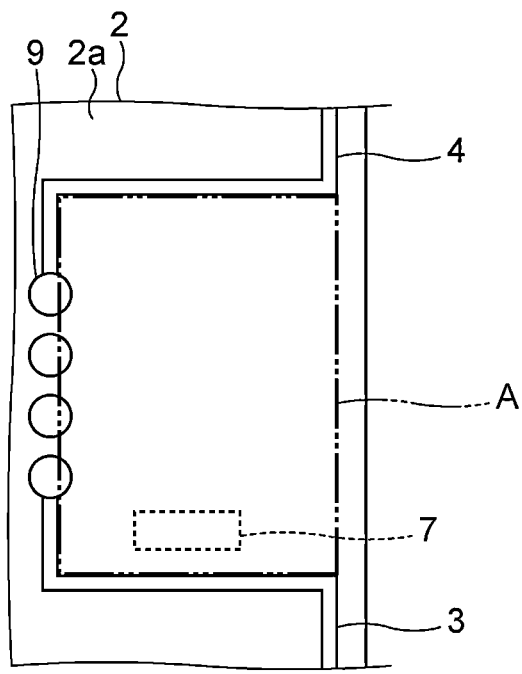
FIG. 3 is a schematic plan view for explaining an inter-wiring-line region in the first example embodiment of the present invention.

The first signal wiring line 3 and the second signal wiring line 4 face each other. It is sufficient that at least a portion of the first signal wiring line 3 and at least a portion of the second signal wiring line 4 face each other. As illustrated in FIG. 3, the first layer 2a of the mounting substrate 2 includes an inter-wiring-line region A. The inter-wiring-line region A is a region between the first signal wiring line 3 and the second signal wiring line 4. In plan view, the inter-wiring-line region A has a rectangular or substantially rectangular shape. However, the shape of the inter-wiring-line region A is not limited to the above. In the present specification, "in plan view" refers to viewing from above in FIG. 1. In plan views other than FIG. 2 and FIG. 3, a position of the inter-wiring-line region A may be indicated by a double-headed arrow.

Figure 4:
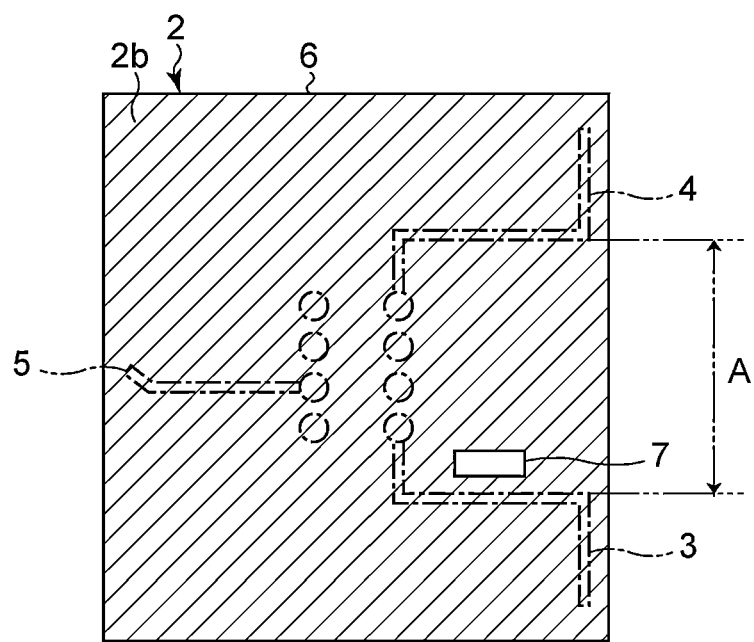
FIG. 4 is a schematic plan view illustrating an electrode configuration on a second layer of a mounting substrate in the first example embodiment of the present invention.

FIG. 4 is a schematic plan view illustrating an electrode configuration on the second layer of the mounting substrate in the first example embodiment. In FIG. 4, an electrode is hatched.

A ground electrode 6 is provided on the second layer 2b of the mounting substrate 2. More specifically, the ground electrode 6 is provided on a main surface of the second layer 2b close to the first layer 2a. The ground electrode 6 is provided on most of the main surface of the second layer 2b. The ground electrode 6 overlaps the first signal wiring line 3 and the second signal wiring line 4 in plan view. That is, the ground electrode 6 faces both of the first signal wiring line 3 and the second signal wiring line 4 in a lamination direction of the mounting substrate 2. Further, the ground electrode 6 overlaps the inter-wiring-line region A in plan view.

More specifically, a portion of the second layer 2b of the mounting substrate 2 that overlaps the inter-wiring-line region A in plan view is provided with a ground electrode missing portion 7. The ground electrode missing portion 7 has a rectangular shape in plan view. More specifically, a dimension of a long side of the ground electrode missing portion 7 is about 20 mm, and a dimension of a short side is about 0.5 mm. The ground electrode missing portion 7 does not reach an outer peripheral edge of the ground electrode 6. However, the shape and the dimensions of the ground electrode missing portion 7 are not limited to the above. An entirety of the second layer 2b, except for the ground electrode missing portion 7, of the portion overlapping the inter-wiring-line region A in plan view is provided with the ground electrode 6.

In the present example embodiment, the ground electrode 6 overlaps the first signal wiring line 3, the second signal wiring line 4, and the inter-wiring-line region A in plan view, and the portion overlapping the inter-wiring-line region A in plan view includes the ground electrode missing portion 7. Thus, isolation characteristics can be improved. Details of this will be explained below together with a circuit configuration of the acoustic wave filter 1 in the present example embodiment.

Figure 5:
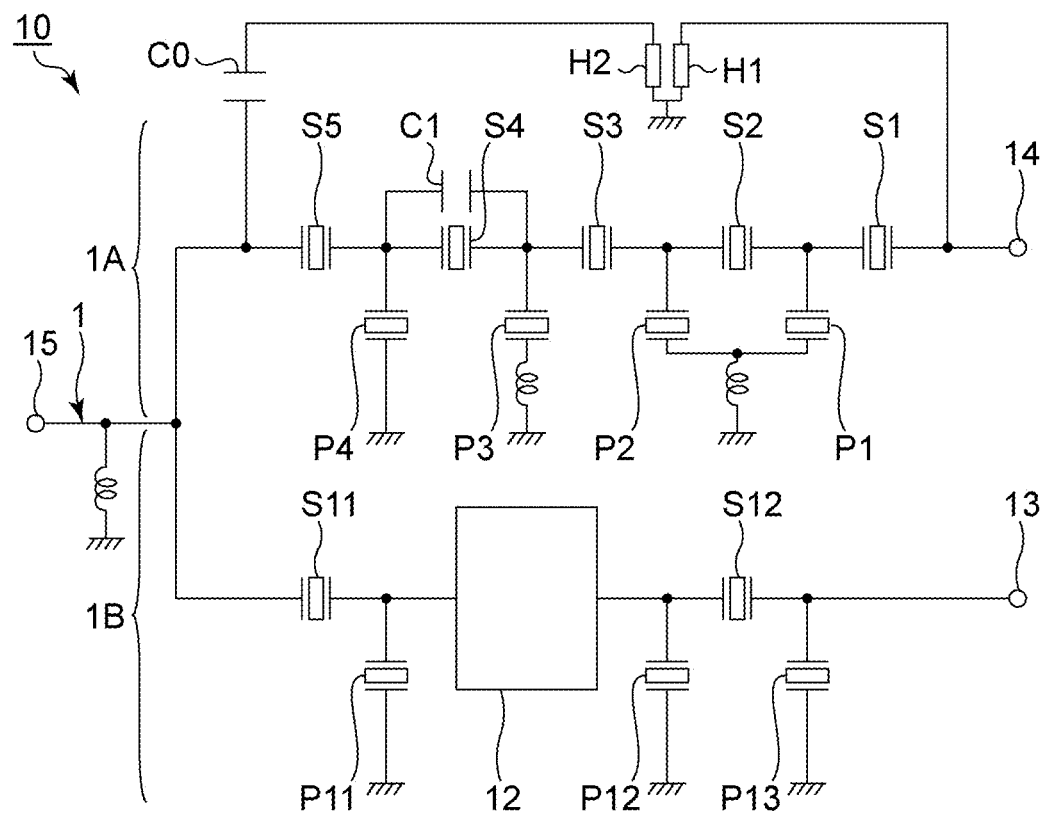
FIG. 5 is a schematic circuit diagram of the acoustic wave device according to the first example embodiment of the present invention.

FIG. 5 is a schematic circuit diagram of the acoustic wave device according to the first example embodiment.

The acoustic wave filter 1 in the acoustic wave device 10 is, for example, a duplexer in Band 8. In the acoustic wave filter 1, a transmission filter 1A and a reception filter 1B are connected in common to a common connection terminal 15. A pass band of the transmission filter 1A is, for example, from about 880 MHz to about 915 MHz. A pass band of the reception filter 1B is, for example, from about 925 MHz to about 960 MHz. However, the communication bands of the acoustic wave filter 1 are not limited to the above.

The transmission filter 1A is, for example, a ladder filter. The transmission filter 1A includes an input terminal 14. The input terminal 14 is electrically connected to the second signal wiring line 4 of the mounting substrate 2 with the bump 9 illustrated in FIG. 2 interposed therebetween. As illustrated in FIG. 5, a series-arm resonator S1, a series-arm resonator S2, a series-arm resonator S3, a series-arm resonator S4 and a series-arm resonator S5 are connected in series with each other between the input terminal 14 and the common connection terminal 15. A capacitive element C1 is connected between the series-arm resonator S3 and the series-arm resonator S5 in parallel to the series-arm resonator S4.

A parallel-arm resonator P1 is connected between a ground potential and a connection point between the series-arm resonator S1 and the series-arm resonator S2. A parallel-arm resonator P2 is connected between the ground potential and a connection point between the series-arm resonator S2 and the series-arm resonator S3. A parallel-arm resonator P3 is connected between the ground potential and a connection point between the series-arm resonator S3 and the series-arm resonator S4. A parallel-arm resonator P4 is connected between the ground potential and a connection point between the series-arm resonator S4 and the series-arm resonator S5.

An inductor H1 is connected between the ground potential and a connection point between the input terminal 14 and the series-arm resonator S1. The inductor H1 is provided by mounting the acoustic wave filter 1 on the mounting substrate 2. To be more specific, the inductor H1 is defined by the ground electrode 6 of the mounting substrate 2 illustrated in FIG. 1.

On the other hand, as illustrated in FIG. 5, a capacitance portion C0 and an inductor H2 are connected between the ground potential and a connection point between the series-arm resonator S5 and the common connection terminal 15. Wiring lines of the transmission filter 1A and the ground electrode 6 of the mounting substrate 2 illustrated in FIG. 1 face each other. Thus, the capacitance portion C0 is provided. The inductor H2 is defined by the ground electrode 6, as in the inductor H1.

On the other hand, as illustrated in FIG. 5, the reception filter 1B includes an output terminal 13. The output terminal 13 is electrically connected to the first signal wiring line 3 of the mounting substrate 2 with the bump 9 illustrated in FIG. 2 interposed therebetween. Referring back to FIG. 5, a longitudinally coupled resonator acoustic wave filter 12 is connected between the output terminal 13 and the common connection terminal 15. The longitudinally coupled resonator acoustic wave filter 12 is, for example, a 7-IDT type. However, the number of IDT electrodes in the longitudinally coupled resonator acoustic wave filter 12 is not limited to seven. For example, the longitudinally coupled resonator acoustic wave filter 12 may be of a 3-IDT type, a 5-IDT type, or a 9-IDT type.

A series-arm resonator S11 is connected between the longitudinally coupled resonator acoustic wave filter 12 and the common connection terminal 15. A parallel-arm resonator P11 is connected between the ground potential and a connection point between the series-arm resonator S11 and the longitudinally coupled resonator acoustic wave filter 12. A series-arm resonator S12 is connected between the longitudinally coupled resonator acoustic wave filter 12 and the output terminal 13. A parallel-arm resonator P12 is connected between the ground potential and a connection point between the longitudinally coupled resonator acoustic wave filter 12 and the series-arm resonator S12. A parallel-arm resonator P13 is connected between the ground potential and a connection point between the series-arm resonator S12 and the output terminal 13. The plurality of series-arm resonators and the plurality of parallel-arm resonators of the reception filter 1B are resonators for characteristic adjustment. The circuit configuration of the acoustic wave filter 1 is not limited to the above.

Hereinafter, advantageous effects of the present example embodiment will be described in detail by comparing the present example embodiment with a comparative example. The comparative example is different from the present example embodiment in that the comparative example does not include a ground electrode missing portion.

Figure 6:
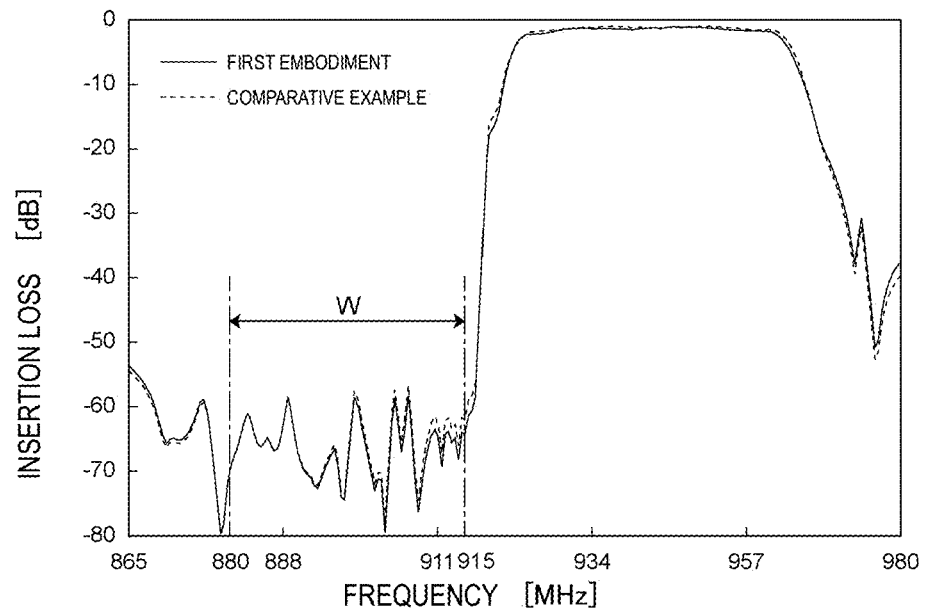
FIG. 6 is a graph showing attenuation-frequency characteristics of reception filters in acoustic wave filters of the first example embodiment of the present invention and a comparative example.
Figure 7:
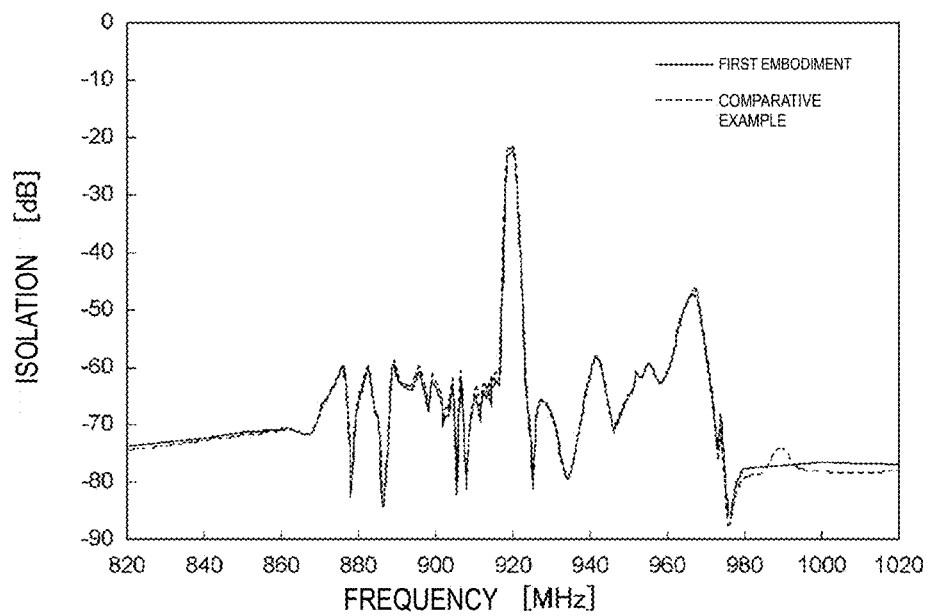
FIG. 7 is a graph showing isolation characteristics of the acoustic wave device of the first example embodiment of the present invention and an acoustic wave device of the comparative example.

FIG. 6 is a graph showing attenuation-frequency characteristics of the reception filter in the acoustic wave filter of the first example embodiment, and a reception filter in an acoustic wave filter of the comparative example. FIG. 7 is a graph showing isolation characteristics of the acoustic wave device of the first example embodiment and an acoustic wave device of the comparative example. A band W in FIG. 6 indicates the pass band of the transmission filter 1A.

As shown in FIG. 6, it is understood that an out-of-band attenuation on a low frequency side can be increased in the reception filter 1B of the first example embodiment as compared with the comparative example. In particular, the attenuation can be increased in the band W, which is the pass band of the transmission filter 1A. Thus, as shown in FIG. 7, the isolation characteristics can be improved in the first example embodiment as compared with the comparative example. A reason for this will be explained with reference to FIG. 8 and FIG. 9.

Figure 8:
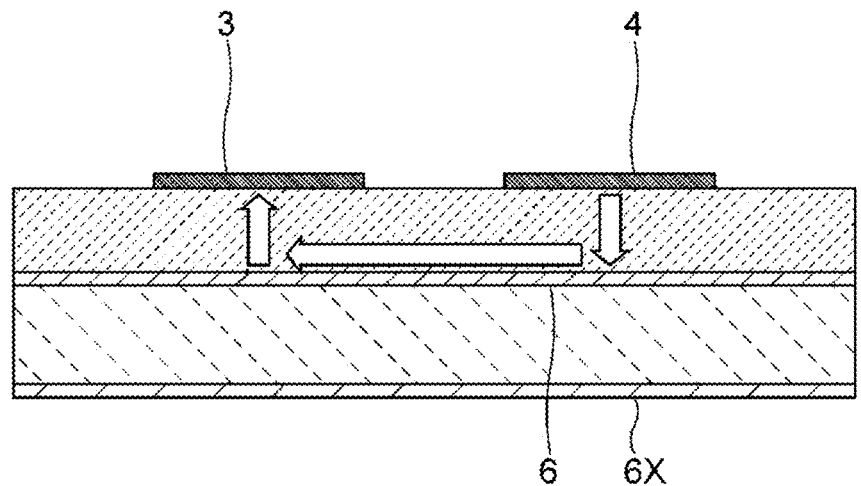
FIG. 8 is a schematic elevational cross-sectional view of a mounting substrate in the comparative example.
Figure 9:
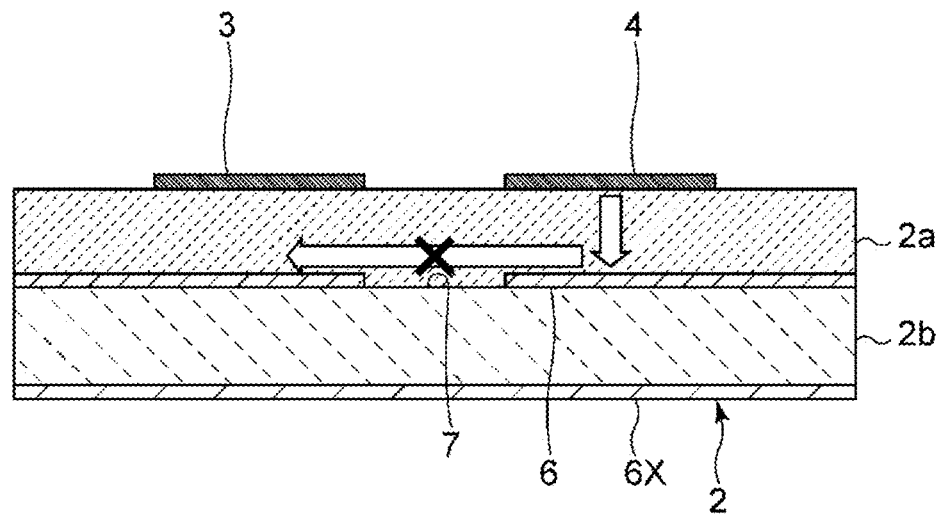
FIG. 9 is a schematic elevational cross-sectional view of the mounting substrate in the first example embodiment of the present invention.

FIG. 8 is a schematic elevational cross-sectional view of a mounting substrate in the comparative example. FIG. 9 is a schematic elevational cross-sectional view of the mounting substrate in the first example embodiment.

As illustrated in FIG. 8, when the first signal wiring line 3 and the ground electrode 6 face each other, capacitive coupling occurs between the first signal wiring line 3 and the ground electrode 6. Similarly, when the second signal wiring line 4 and the ground electrode 6 face each other, capacitive coupling also occurs between the second signal wiring line 4 and the ground electrode 6. Thus, a signal leaks from the first signal wiring line 3 or the second signal wiring line 4 to the ground electrode 6. The ground electrode 6 is connected to the ground potential. Thus, ideally, all signals reaching the ground electrode 6 flow outward. However, in practice, some of signals reaching the ground electrode 6 do not flow outward and reach the other capacitively coupled signal wiring line. Thus, the isolation characteristics are deteriorated. However, when an area of the ground electrode 6 is sufficiently large, and impedance of the ground electrode 6 is sufficiently low, the above-described ideal state is approached. On the other hand, in a small-sized acoustic wave device mounted on a communication terminal or the like, it is difficult to sufficiently increase the area of the ground electrode 6. Thus, the isolation characteristics are likely to be deteriorated.

On the other hand, in the first example embodiment illustrated in FIG. 9, the second layer 2b of the mounting substrate 2 includes the ground electrode missing portion 7. A path through which a signal leaking from one signal wiring line of the first signal wiring line 3 and the second signal wiring line 4 reaches the other signal wiring line is a path bypassing the ground electrode missing portion 7.

Thus, the path is lengthened. This increases the impedance of the path. Thus, a signal leaking from the one signal wiring line is less likely to reach the other signal wiring line. Thus, the isolation characteristics can be improved.

In the first example embodiment, the entirety or substantially the entirety of the second layer 2b of the mounting substrate 2, except for the ground electrode missing portion 7, of the portion overlapping the inter-wiring-line region A in plan view is provided with the ground electrode 6. In this way, it is possible to reduce or prevent propagation of signals between the signal wiring lines without reducing the area of the ground electrode 6. Thus, the impedance of the ground electrode 6 is unlikely to be high, and a signal is likely to flow outward. Thus, the isolation characteristics can be improved more reliably.

As described above, most of the second layer 2b of the mounting substrate 2 is provided with the ground electrode 6. In addition to the ground electrode 6, the second layer 2b may be provided with an electrode other than the ground electrode 6.

The mounting substrate 2 of the acoustic wave device 10 have, for example, a two-layer configuration. Thus, as illustrated in FIG. 1, the second layer 2b includes a ground electrode 6X connected to an outside. To be more specific, one main surface of the second layer 2b is provided with the ground electrode 6, and the other main surface is provided with the ground electrode 6X. Most of the main surface is provided with the ground electrode 6X. The ground electrode 6X is connected to the ground electrode 6 by a via electrode. However, the number of layers of the mounting substrate 2 is not limited to two. The mounting substrate 2 may include a layer other than the first layer 2a and the second layer 2b, and the second layer 2b may be provided on another layer. In this case, the second layer 2b need not include the ground electrode 6X.

In the mounting substrate 2, an outermost layer may be provided on the first layer 2a. The acoustic wave filter 1 may be provided on the outermost layer. In this case, it is sufficient that the first signal wiring line 3, the second signal wiring line 4, and the third signal wiring line 5 are electrically connected to the acoustic wave filter 1 by via electrodes penetrating the outermost layer, or the like.

Alternatively, for example, an intermediate layer may be provided between the first layer 2a and the second layer 2b. However, it is preferable that the second layer 2b is adjacent to the first layer 2a. In this case, a signal is easily propagated from one of the first signal wiring line 3 and the second signal wiring line 4 to the other. Thus, example embodiments of the present invention are suitable when the second layer 2b is adjacent to the first layer 2a.

In plan view, a shape of a portion of the first signal wiring line 3 facing the second signal wiring line 4 has a longitudinal direction. In plan view, a shape of the ground electrode missing portion 7 also has a longitudinal direction. The longitudinal direction of the portion of the first signal wiring line 3 facing the second signal wiring line 4 is preferably parallel or substantially parallel to the longitudinal direction of the ground electrode missing portion 7. This makes it possible to efficiently increase an inductance of a path through which a signal leaking from one of the first signal wiring line 3 and the second signal wiring line 4 to the ground electrode 6 reaches the other signal wiring line. Thus, the isolation characteristics can be efficiently improved. Although the first signal wiring line 3 is connected to the reception filter 1B, the inductance can be efficiently increased as described above also when the first signal wiring line 3 is connected to the transmission filter 1A.

Figure 10:
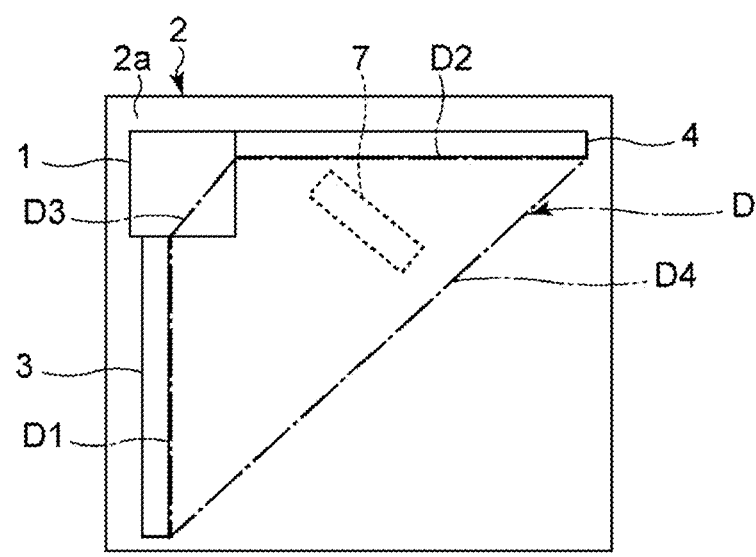
FIG. 10 is a schematic plan view of an acoustic wave device according to a first modification of the first example embodiment of the present invention.

In the first example embodiment, the first signal wiring line 3 and the second signal wiring line 4 extend in parallel or substantially in parallel at the portion where the first signal wiring line 3 and the second signal wiring line 4 face each other. As described above, the inter-wiring-line region A has a rectangular or substantially rectangular shape in plan view. However, the positional relationship between the first signal wiring line 3 and the second signal wiring line 4 is not limited to the above. In a first modification of the first example embodiment illustrated in FIG. 10, a direction in which the first signal wiring line 3 extends and a direction in which the second signal wiring line 4 extends intersect with each other. More specifically, the direction in which the first signal wiring line 3 extends and the direction in which the second signal wiring line 4 extends are orthogonal or substantially orthogonal to each other. Thus, an inter-wiring-line region D of the present modification has a trapezoidal or substantially trapezoidal shape in plan view. Also in this case, the isolation characteristics can be improved as in the first example embodiment.

In the present modification, the inter-wiring-line region D includes a first side D1, a second side D2, a third side D3 and a fourth side D4 in plan view. The first side D1 is a side corresponding to the first signal wiring line 3. The second side D2 is a side corresponding to the second signal wiring line 4. The third side D3 and the fourth side D4 are connected to the first side D1 and the second side D2, and face each other. The third side D3 is preferably shorter than the fourth side D4. The ground electrode missing portion 7 may extend in a direction orthogonal or substantially orthogonal to one of the third side D3 and the fourth side D4. In the present modification, the ground electrode missing portion 7 extends in a direction orthogonal or substantially orthogonal to the third side D3.

Figure 11:
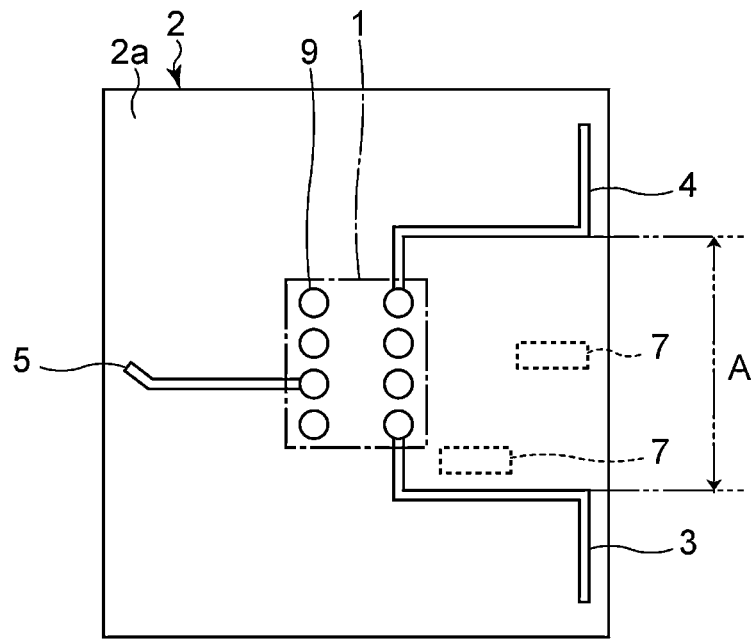
FIG. 11 is a schematic plan view of an acoustic wave device according to a second modification of the first example embodiment of the present invention.

In the first example embodiment, the ground electrode missing portion 7 is provided at one location. However, the present invention is not limited thereto. In a second modification of the first example embodiment illustrated in FIG. 11, a plurality of ground electrode missing portions 7 are provided at a portion of the second layer overlapping the inter-wiring-line region A in plan view. When viewed from a direction orthogonal or substantially orthogonal to a longitudinal direction of a portion where the first signal wiring line 3 faces the second signal wiring line 4, the plurality of ground electrode missing portions 7 do not overlap each other. However, the arrangement of the plurality of ground electrode missing portions 7 is not limited to the above.

Figure 12:
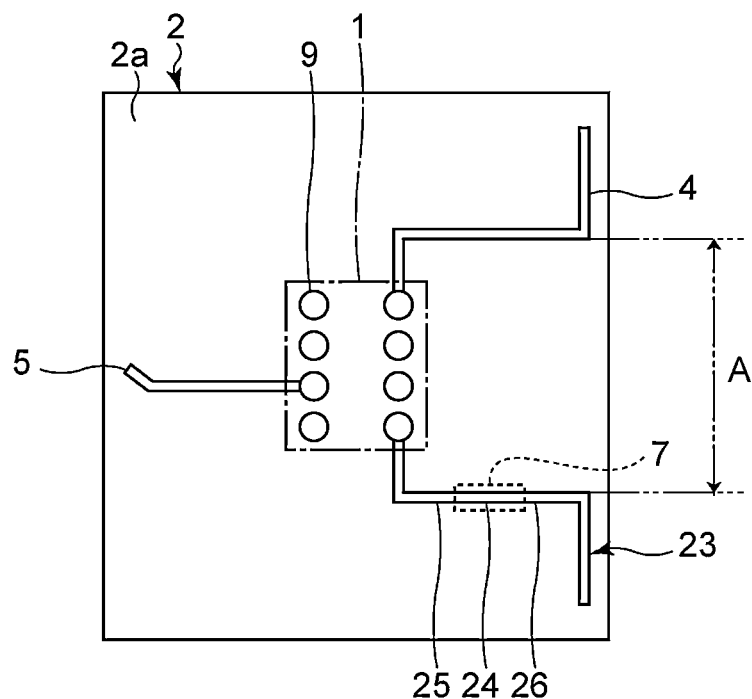
FIG. 12 is a schematic plan view of an acoustic wave device according to a second example embodiment of the present invention.

FIG. 12 is a schematic plan view of an acoustic wave device according to a second example embodiment of the present invention.

The present example embodiment is different from the first example embodiment in that a portion of the ground electrode missing portion 7 overlaps a first signal wiring line 23 in plan view. Another portion of the ground electrode missing portion 7 overlaps the inter-wiring-line region A in plan view. Except for the above points, the acoustic wave device of the present example embodiment has a configuration the same as or similar to that of the acoustic wave device 10 of the first example embodiment.

The first signal wiring line 23 includes a missing portion facing portion 24, a first adjacent portion 25, and a second adjacent portion 26. The missing portion facing portion 24 is a portion of the first signal wiring line 23 that overlaps the ground electrode missing portion 7 in plan view. The first adjacent portion 25 and the second adjacent portion 26 are portions located on each side of the missing portion facing portion 24. The first adjacent portion 25 is located closer to the acoustic wave filter 1 than the second adjacent portion 26. More specifically, the first adjacent portion 25 is located between a portion of the first signal wiring line 23 connected to the acoustic wave filter 1, and the missing portion facing portion 24.

Also in the present example embodiment, the isolation characteristics can be improved. This will be illustrated by comparing the present example embodiment with the comparative example. The comparative example is different from the present example embodiment in that the comparative example does not include the ground electrode missing portion 7. The isolation characteristics in the first example embodiment are also shown.

Figure 13:
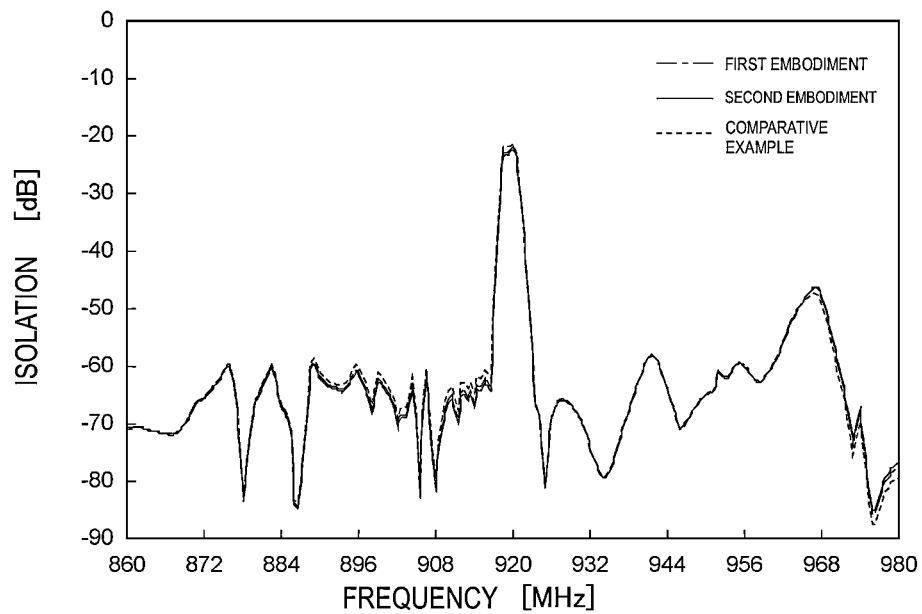
FIG. 13 is a graph showing isolation characteristics of the acoustic wave devices of the first example embodiment of the present invention and the comparative example, and an acoustic wave device of the second example embodiment of the present invention.
Figure 14:
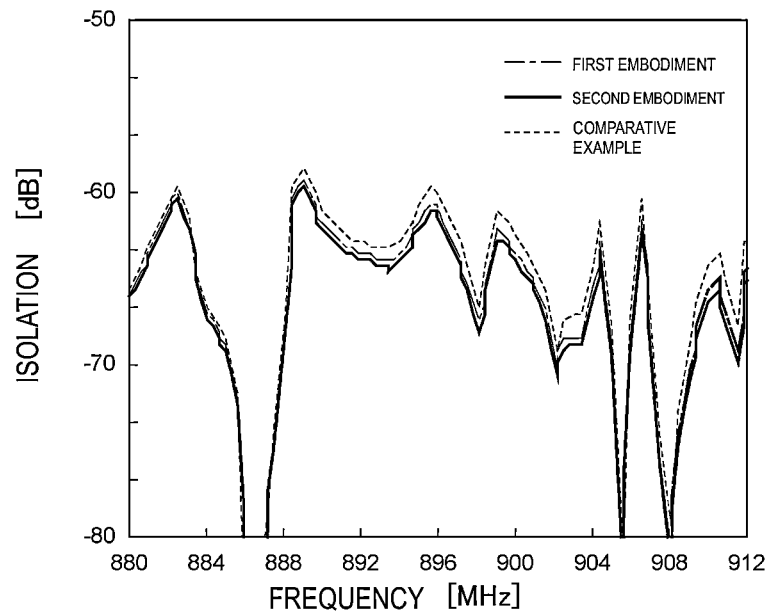
FIG. 14 is an enlarged view of FIG. 13.

FIG. 13 is a graph showing isolation characteristics of the acoustic wave devices of the first example embodiment, the second example embodiment and the comparative example. FIG. 14 is an enlarged view of FIG. 13.

As shown in FIG. 13, it is understood that the isolation characteristics are improved in the first example embodiment and the second example embodiment as compared with the comparative example. Furthermore, as shown in FIG. 14, the isolation characteristics in the second example embodiment are improved as compared with the first example embodiment. In the second example embodiment, a signal is less likely to leak to the ground electrode 6 in the missing portion facing portion 24 of the first signal wiring line 23. Thus, the isolation characteristics can be effectively improved.

Furthermore, in the second example embodiment, an attenuation of a harmonic wave can be increased. This will be illustrated below by comparing the second example embodiment with the above-described comparative example.

Figure 15:
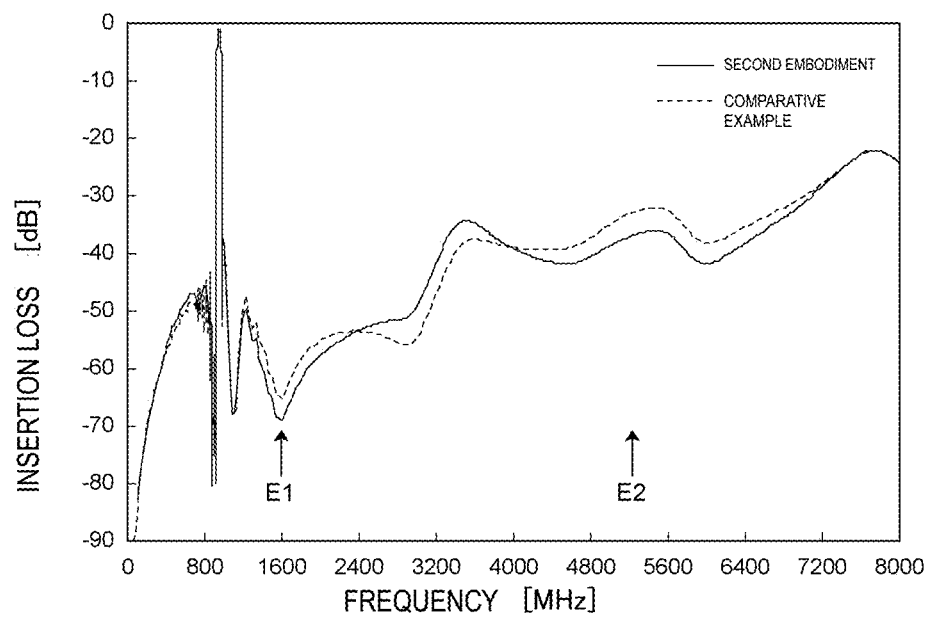
FIG. 15 is a graph showing attenuation-frequency characteristics of a reception filter of the second example embodiment of the present invention and the reception filter of the comparative example.

FIG. 15 is a graph showing attenuation-frequency characteristics of reception filters of the second example embodiment and the comparative example.

As indicated by an arrow E1 and an arrow E2 in FIG. 15, it is understood that an attenuation of a harmonic wave is larger in the second example embodiment than in the comparative example. This is because a characteristic impedance is increased in the missing portion facing portion 24 of the first signal wiring line 23. Thus, the missing portion facing portion 24 is equivalent to a series inductor on a circuit. Therefore, the missing portion facing portion 24 defines and functions as a low pass filter, and the attenuation of the harmonic wave can be increased.

Also when the first signal wiring line 23 is connected to the transmission filter 1A, the isolation characteristics can be effectively improved, and the attenuation of the harmonic wave can be increased.

Figure 16:
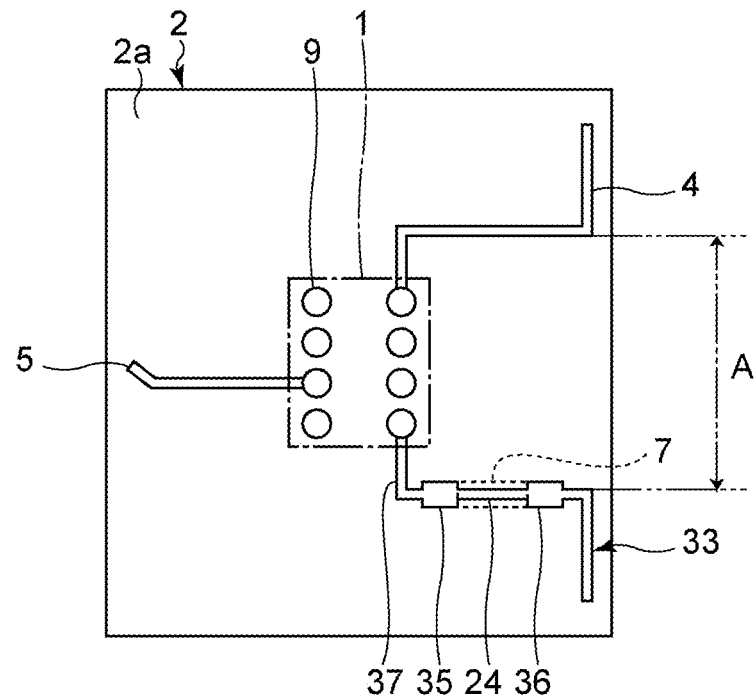
FIG. 16 is a schematic plan view of an acoustic wave device according to a third example embodiment of the present invention.

FIG. 16 is a schematic plan view of an acoustic wave device according to a third example embodiment of the present invention.

The present example embodiment is different from the second example embodiment in that widths of a first adjacent portion 35 and a second adjacent portion 36 are greater than a width of the missing portion facing portion 24 in a first signal wiring line 33. Thus, a characteristic impedance of the first adjacent portion 35 and a characteristic impedance of the second adjacent portion 36 are lower than the characteristic impedance of the missing portion facing portion 24. Except for the above points, an acoustic wave device of the present example embodiment has a configuration the same as or similar to that of the acoustic wave device of the second example embodiment.

Also in the present example embodiment, the second layer 2b includes the ground electrode missing portion 7, and the first signal wiring line 33 includes the missing portion facing portion 24, so that the isolation characteristics can be effectively improved, and the attenuation of the harmonic wave is increased.

The characteristic impedance is high in the missing portion facing portion 24 of the first signal wiring line 33. Thus, deviation may occur between a pass band impedance of the acoustic wave filter 1 and a characteristic impedance of the first signal wiring line 33. In the present example embodiment, characteristic impedances of the first adjacent portion 35 and the second adjacent portion 36 are lower than the characteristic impedance of the missing portion facing portion 24. This makes it possible to reduce a mean value of the characteristic impedances of the first signal wiring line 33. Thus, deviation is less likely to occur between the pass band impedance of the acoustic wave filter 1 and the characteristic impedance of the first signal wiring line 33. The pass band impedance in this case is a pass band impedance of the acoustic wave filter 1 as viewed from the output terminal 13 illustrated in FIG. 5. The output terminal 13 is a signal terminal connected to the first signal wiring line 33 in the present example embodiment. The above advantageous effects are shown by FIG. 17.

Figure 17:
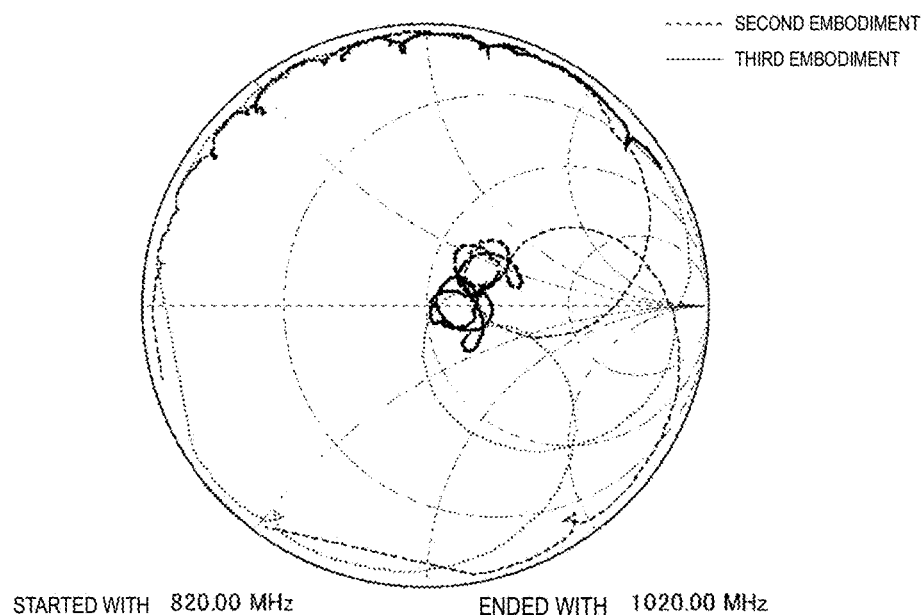
FIG. 17 is a Smith chart in the acoustic wave devices according to the second example embodiment and the third example embodiment of the present invention.

FIG. 17 is a Smith chart in the acoustic wave devices according to the second example embodiment and the third example embodiment.

As shown in FIG. 17, in the third example embodiment of the present invention, a trajectory is located at a vicinity of a center. On the other hand, in a trajectory in the second example embodiment, deviation from the vicinity of the center occurs. In the second example embodiment, the characteristic impedance is high in the missing portion facing portion 24. This is because the deviation occurred in the characteristic impedance of the first signal wiring line 23 from the pass band impedance of the acoustic wave filter 1. On the other hand, in the third example embodiment, as described above, the mean value of the characteristic impedances in the first signal wiring line 33 can be reduced. This makes it possible to more reliably reduce or prevent deviation between the pass band impedance of the acoustic wave filter 1 and the characteristic impedance of the first signal wiring line 33. Thus, deterioration of filter characteristics can be reduced or prevented more reliably.

As illustrated in FIG. 16, the first signal wiring line 33 includes a filter proximity portion 37. The filter proximity portion 37 is located between a portion of the first signal wiring line 33 connected to the acoustic wave filter 1, and the first adjacent portion 35. It is preferable, for example, that $Z2<Z1<Z3$, where $Z1$ is a characteristic impedance of the filter proximity portion 37, $Z2$ is a characteristic impedance of the first adjacent portion 35 and a characteristic impedance of the second adjacent portion 36, and $Z3$ is a characteristic impedance of the missing portion facing portion 24. In this case, it is possible to further more reliably reduce or prevent deviation between the pass band impedance of the acoustic wave filter 1 and the characteristic impedance of the first signal wiring line 33.

It is preferable, for example, that $Z5<Z4<Z6$, where $Z4$ is a mean value of the characteristic impedances of the missing portion facing portion 24, the first adjacent portion 35 and the second adjacent portion 36, and $Z5$ and $Z6$ are a lower limit and an upper limit, respectively, of a range of a real part in the pass band impedance of the acoustic wave filter 1. In this case, for example, a median value (Z5+Z6)/2 of the real part of the pass band impedance of the acoustic wave filter 1 can be made closer to the mean value Z4. Thus, deterioration of the filter characteristics can be reduced or prevented further more reliably.

In the third example embodiment, a length of the missing portion facing portion 24 of the first signal wiring line 33 is, for example, about 20 mm, and the characteristic impedance is, for example, about 100Ω. The first adjacent portion 35 and the second adjacent portion 36 each have a length of, for example, about 10 mm, and have the characteristic impedance of, for example, about 38Ω. Thus, the mean value Z4 of the characteristic impedances of the missing portion facing portion 24, the first adjacent portion 35 and the second adjacent portion 36 is, for example, about (100 Ω+38Ω)/2=69Ω. The real part of the pass band impedance of the acoustic wave filter 1 is, for example, equal to or greater than about 52Ω and equal to or less than about 87Ω. Thus, for example, the lower limit Z5 is about 52Ω, and the upper limit Z6 is about 87Ω. In the third example embodiment, the relationship Z5<Z4<Z6 is established. Then, the median value (Z5+Z6)/2 of the real part of the pass band impedance of the acoustic wave filter 1 is, for example, about (52 Ω+87Ω)/2=69.5Ω. Thus, the mean value Z4 and the above median value coincide or substantially coincide. Thus, deterioration of the filter characteristics can be effectively reduced or prevented.

As described above, the missing portion facing portion 24 of the first signal wiring line 33 is equivalent or substantially equivalent to the inductor on the circuit. On the other hand, the first adjacent portion 35 and the second adjacent portion 36 are equivalent or substantially equivalent to capacitive elements on the circuit. Thus, the missing portion facing portion 24, the first adjacent portion 35 and the second adjacent portion 36 are equivalent or substantially equivalent to a circuit configuration in which an inductor is sandwiched between capacitive elements. Thus, the missing portion facing portion 24, the first adjacent portion 35 and the second adjacent portion 36 define and function as a low pass filter. Thus, an attenuation of a radio-frequency wave can be effectively increased.

Figure 18:
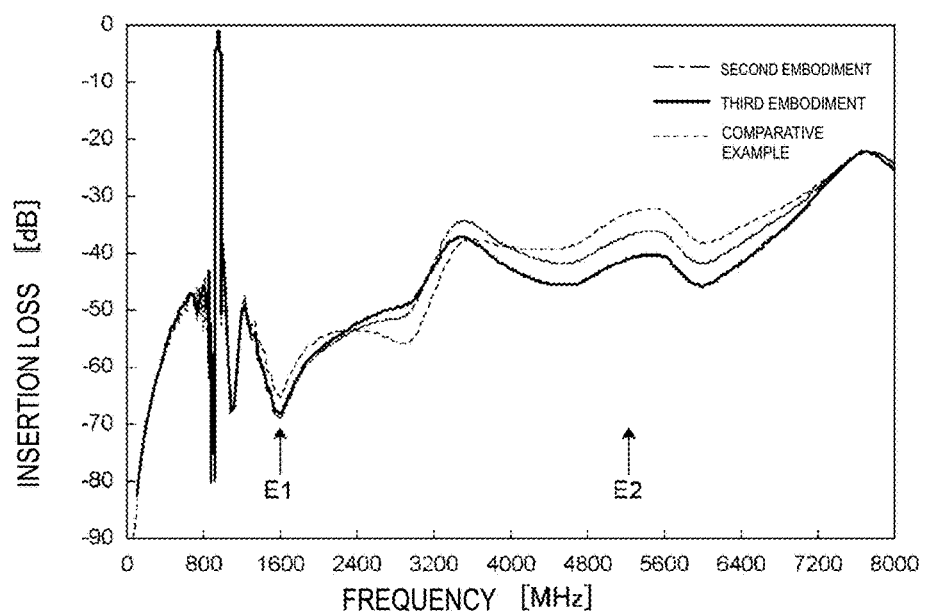
FIG. 18 is a graph showing attenuation-frequency characteristics of the reception filters of the second example embodiment of the present invention and the comparative example, and a reception filter of the third example embodiment of the present invention.

FIG. 18 is a graph showing attenuation-frequency characteristics of the reception filters of the second example embodiment and the comparative example, and a reception filter of the third example embodiment.

As indicated by the arrow E1 and the arrow E2 in FIG. 18, in the third example embodiment, an attenuation of a harmonic wave can be increased as compared with the comparative example. In addition, in the third example embodiment, the attenuation of the harmonic wave can be further increased as compared with the second example embodiment.

Here, an amount of deviation between the pass band impedance of the acoustic wave filter 1 and the characteristic impedance of the first signal wiring line 33 was calculated for each case while the lengths of the first adjacent portion 35 and the second adjacent portion 36 were changed. The lengths of the first adjacent portion 35 and the second adjacent portion 36 in this case are lengths of portions that are located on each side of the missing portion facing portion 24 and have widths larger than the width of the missing portion facing portion 24. The pass band impedance of the acoustic wave filter 1 is Zfil, the real part of the pass band impedance is Re(Zfil), and an imaginary part is Im(Zfil). The characteristic impedance of the first signal wiring line 33 is Ztrans, a real part of the characteristic impedance is Re(Ztrans), and an imaginary part is Im(Ztrans). The above amount of deviation is referred to as an impedance deviation amount. The impedance deviation amount is represented by $\{(\text{Re}(Z\text{fil})-\text{Re}(Z\text{trans}))^2+(\text{Im}(Z\text{fil})-\text{Im}(Z\text{trans}))^2\}^{0.5}$. In the following description, the length of the missing portion facing portion 24 is L, and a total length of the first adjacent portion 35 and the second adjacent portion 36 is L2.

Figure 19:
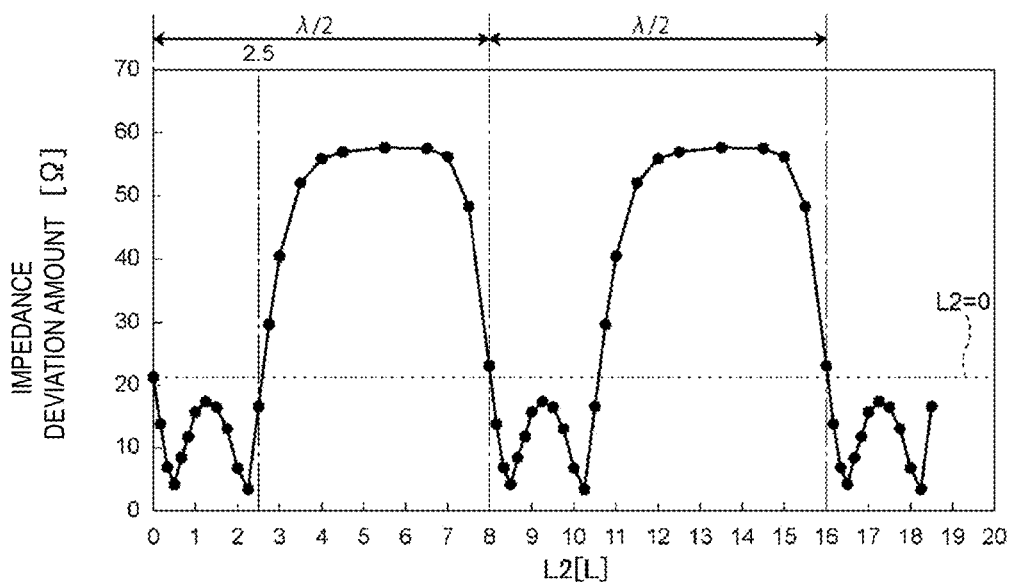
FIG. 19 is a graph showing a relationship between total length of a first adjacent portion and a second adjacent portion, and amount of deviation between a pass band impedance of an acoustic wave filter and a characteristic impedance of a first signal wiring line.

FIG. 19 is a graph showing a relationship between the total length of the first adjacent portion and the second adjacent portion, and the amount of deviation between the pass band impedance of the acoustic wave filter and the characteristic impedance of the first signal wiring line. The length L2 on a horizontal axis in FIG. 19 is shown as a value normalized by the length L. A broken line in FIG. 19 indicates the impedance deviation amount when L2=0.

As shown in FIG. 19, it is understood that the impedance deviation amount is small when the total length L2 of the first adjacent portion 35 and the second adjacent portion 36 is, for example, greater than 0 times the length L of the missing portion facing portion 24 and equal to or less than about 2.5 times the length L. Thus, when 0<L2≤2.5 L, deviation between the pass band impedance of the acoustic wave filter 1 and the characteristic impedance of the first signal wiring line 33 can be reduced or prevented.

Further, the impedance deviation amount changes at a constant period. This period is, for example, $\lambda/2$, where $\lambda$ is an electrical wavelength in the pass band of the acoustic wave filter 1. $\lambda=c/(f\times\varepsilon\text{eff}^{0.5})$, where f is any desired frequency in the above pass band, c is the speed of light, and εeff is an effective dielectric constant of the first signal wiring line 33. When the first signal wiring line 33 is a micro split line as in the present example embodiment, the effective dielectric constant εeff is, for example, equal to or greater than about 0.4 times a dielectric constant determined by a material used, and equal to or less than about one times the dielectric constant.

In view of the above period, for example, it is preferable that $n\lambda/2<L2\leq2.5\ L+n\lambda/2$, where n is any desired natural number. This can reduce or prevent deviation between the pass band impedance of the acoustic wave filter 1 and the characteristic impedance of the first signal wiring line 33, and can reduce or prevent deterioration of the filter characteristics.

Hereinafter, a plurality of reference examples of a mounting configuration of an acoustic wave filter will be illustrated. A configuration of a mounting substrate in each of the following reference examples is not limited to the configuration of the mounting substrate according to an example embodiment of the present invention. Thus, for example, a ground electrode missing portion as described above need not be provided in the mounting substrate.

Figure 20:
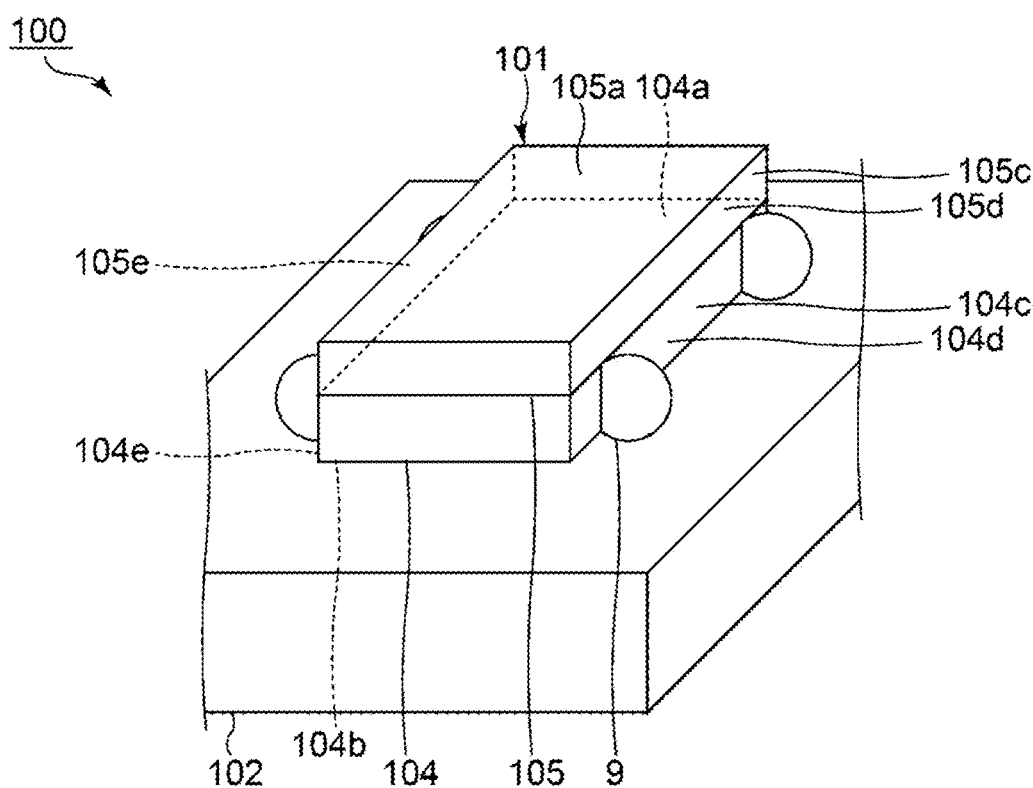
FIG. 20 is a perspective view of an acoustic wave device according to a first reference example.

FIG. 20 is a perspective view of an acoustic wave device according to a first reference example.

An acoustic wave device 100 includes a mounting substrate 102 and an acoustic wave filter 101 mounted on the mounting substrate 102. The acoustic wave filter 101 includes a piezoelectric layer 104 and a cover member 105.

The piezoelectric layer 104 includes a first main surface 104a, a second main surface 104b, and a side surface 104c. The first main surface 104a and the second main surface 104b face each other. The side surface 104c is connected to the first main surface 104a and the second main surface 104b.

In the first reference example, the first main surface 104a and the second main surface 104b of the piezoelectric layer 104 each have a rectangular or substantially rectangular shape. Thus, the side surface 104c of the piezoelectric layer 104 includes four surfaces. The four surfaces are, specifically, a first surface 104d, a second surface 104e, a third surface and a fourth surface. The first surface 104d and the second surface 104e face each other. The first surface 104d and the second surface 104e are connected to portions corresponding to long sides in outer peripheral edges of the first main surface 104a and the second main surface 104b. The third surface and the fourth surface face each other. The third surface and the fourth surface are connected to portions corresponding to short sides of the outer peripheral edges of the first main surface 104a and the second main surface 104b.

Although not illustrated, the first main surface 104a of the piezoelectric layer 104 includes at least one functional electrode. Thus, a filter circuit is provided.

The first main surface 104a of the piezoelectric layer 104 is provided with the cover member 105. The cover member 105 has, specifically, a cap shape. The cover member 105 may have a configuration in which, for example, a frame-shaped member and a plate-shaped cover layer are laminated. Alternatively, the cover member 105 may be a cap member integrally made of the same material.

In the acoustic wave filter 101, a hollow portion surrounded by the piezoelectric layer 104 and the cover member 105 is provided. The functional electrode is provided in the hollow portion. Thus, the acoustic wave filter 101 has a wafer level package (WLP) structure.

The cover member 105 includes an outermost surface 105a and a side surface 105c. The outermost surface 105a faces the first main surface 104a of the piezoelectric layer 104, with a portion of the cover member 105 other than the outermost surface 105a, and the above hollow portion interposed therebetween. The side surface 105c is connected to an outer peripheral edge of the outermost surface 105a. The outermost surface 105a has a rectangular or substantially rectangular shape. Thus, the side surface 105c of the cover member 105 includes four surfaces. The four surfaces are, specifically, a first surface 105d, a second surface 105e, a third surface and a fourth surface. The first surface 105d and the second surface 105e face each other. The first surface 105d and the second surface 105e are connected to portions corresponding to long sides in the outer peripheral edges of the outermost surface 105a. The third surface and the fourth surface face each other. The third surface and the fourth surface are connected to portions corresponding to short sides of the outer peripheral edge of the outermost surface 105a.

The first surface 105d of the cover member 105 is provided close to the first surface 104d of the first surface 104d and the second surface 104e in the piezoelectric layer 104. The shapes of the piezoelectric layer 104 and the cover member 105 are not limited to the above, and the configurations of the side surfaces of the piezoelectric layer 104 and the cover member 105 are not limited to the above.

In the first reference example, the piezoelectric layer 104 of the piezoelectric layer 104 and the cover member 105 is provided close to the mounting substrate 102. The side surface 104c of the piezoelectric layer 104 includes a plurality of bumps 9. To be more specific, a plurality of bumps 9 is provided on each of the first surface 104d and the second surface 104e of the side surface 104c. However, the bumps 9 may be provided on the third surface and the fourth surface.

As illustrated in FIG. 20, the acoustic wave filter 101 is bonded to the mounting substrate 102 by the plurality of bumps 9 provided on the side surface 104c of the piezoelectric layer 104. Although not illustrated, more specifically, each bump 9 is bonded to a terminal provided on the mounting substrate 102.

In the first reference example, the plurality of bumps 9 are electrically connected to the filter circuit. Then, a plurality of bumps 9, that is, some of the bumps 9, are connected to a signal potential. More specifically, for example, at least one bump 9 is connected to an input potential, and at least another bump 9 is connected to an output potential. Further, still another bump 9 is connected to the ground potential. However, some of the bumps 9, out of the bumps 9, need not be electrically connected to the filter circuit. The filter circuit is connected to the input potential, the output potential and the ground potential, with the terminals provided on the mounting substrate 102 interposed therebetween.

The plurality of bumps 9 and the filter circuit are electrically connected to each other by a wiring-line electrode provided on the first main surface 104a of the piezoelectric layer 104. Then, the plurality of bumps 9 and the filter circuit are electrically connected to each other without a via electrode. Thus, a terminal portion electrically connected to the outside is defined by the bump 9 and does not include a via electrode. Therefore, a facing area between terminal portions connected to signal potentials can be reduced. Thus, it is possible to reduce or prevent propagation of signals between the terminal portions connected to the signal potentials. This improves attenuation characteristics. In addition, since the bump 9 is provided on the side surface 104c of the piezoelectric layer 104, a height of the acoustic wave filter 101 can be reduced.

Figure 21:
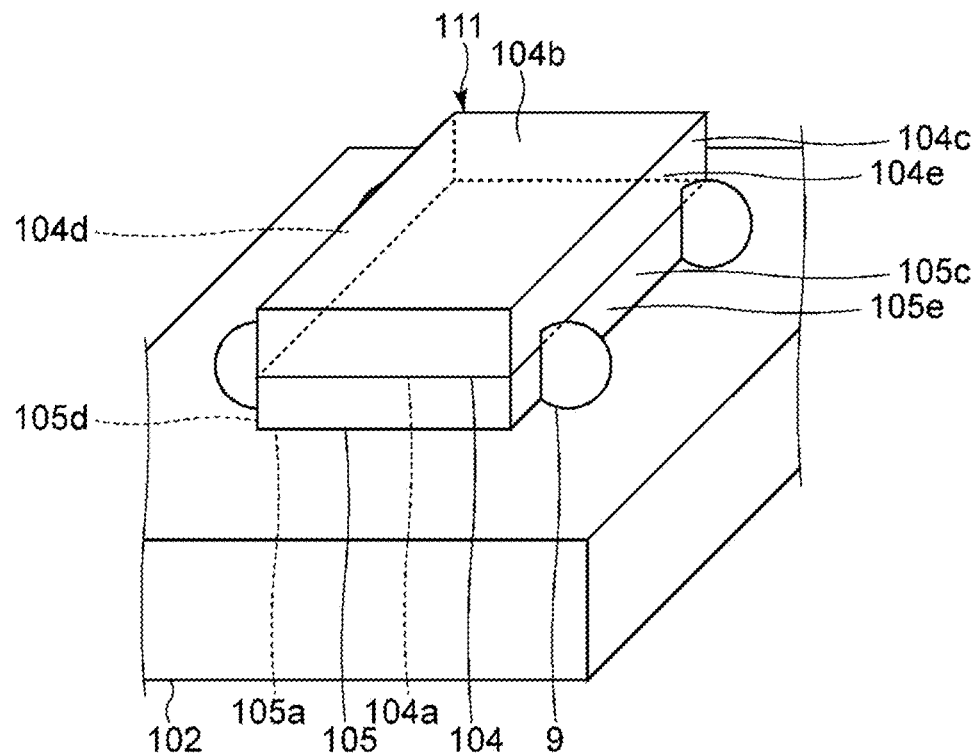
FIG. 21 is a perspective view of an acoustic wave device according to a second reference example.

FIG. 21 is a perspective view of an acoustic wave device according to a second reference example.

The second reference example is different from the first reference example in that the cover member 105, of the piezoelectric layer 104 and the cover member 105, is located close to the mounting substrate 102. The second reference example is different from the first reference example also in that a plurality of bumps 9 are provided over the side surface 105c of the cover member 105 and the side surface 104c of the piezoelectric layer 104. Except for the above points, the acoustic wave device of the second reference example has a configuration the same as or similar to that of the acoustic wave device 100 of the first reference example.

In the second reference example, specifically, the plurality of bumps 9 are provided over the first surface 105d in the side surface 105c of the cover member 105, and the first surface 104d in the side surface 104c of the piezoelectric layer 104. Similarly, a plurality of bumps 9 are provided over the second surface 105e in the cover member 105, and the second surface 104e in the piezoelectric layer 104. Thus, it is possible to reduce a height of an acoustic wave filter 111. The bumps 9 may be provided on the third surface and the fourth surface in each of the piezoelectric layer 104 and the cover member 105.

Also in the second reference example, as in the first reference example, the plurality of bumps 9 and the filter circuit are electrically connected to each other without a via electrode. Accordingly, it is possible to reduce or prevent propagation of signals between terminal portions connected to signal potentials. This improves attenuation characteristics.

Figure 22:
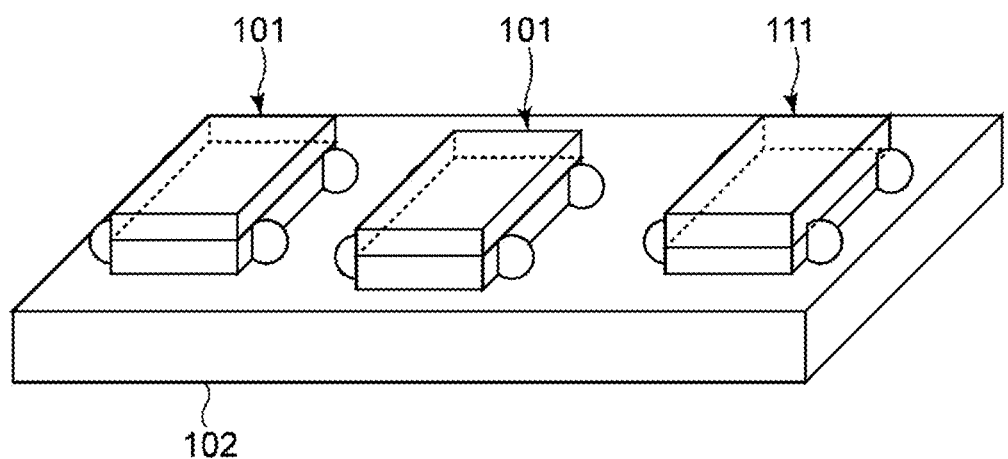
FIG. 22 is a perspective view of an acoustic wave device according to a third reference example.

FIG. 22 is a perspective view of an acoustic wave device according to a third reference example.

In an acoustic wave device 120 of the third reference example, the acoustic wave filter 101 of the first reference example and the acoustic wave filter 111 of the second reference example are mounted on the mounting substrate 102. In each of the acoustic wave filters, a facing area between terminal portions connected to signal potentials can be reduced. Thus, attenuation characteristics can be improved. In addition, a height of each acoustic wave filter can be reduced.

Figure 23:
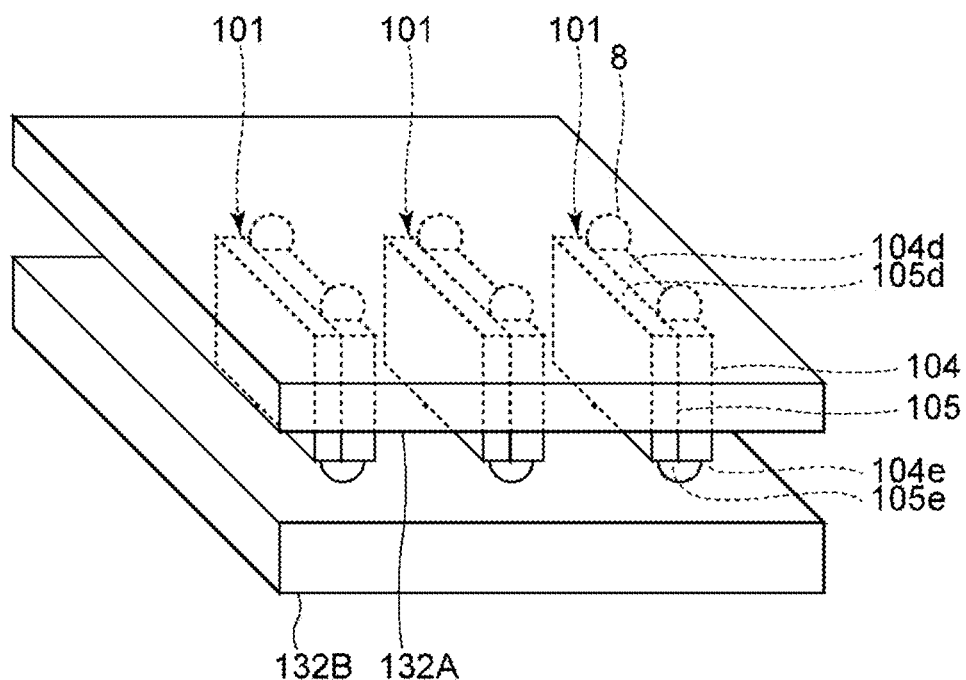
FIG. 23 is a perspective view of an acoustic wave device according to a fourth reference example.

FIG. 23 is a perspective view of an acoustic wave device according to a fourth reference example.

The fourth reference example is different from the third reference example in that a plurality of acoustic wave filters 101 are provided between a first mounting substrate 132A and a second mounting substrate 132B. The fourth reference example is different from the third reference example also in that the fourth reference example does not include the acoustic wave filter 111 of the second reference example. Except for the above points, the acoustic wave device of the fourth reference example has a configuration the same as or similar to that of the acoustic wave device 120 of the third reference example. Also in the fourth reference example, the acoustic wave filter 111 of the second reference example may be provided.

In the fourth reference example, each acoustic wave filter 101 is bonded to the first mounting substrate 132A by a plurality of bumps 9 provided on the first surface 104d in the side surface 104c of the piezoelectric layer 104. In each acoustic wave filter 101, one of the plurality of bumps 9 provided on the first surface 104d is connected to an output potential.

On the other hand, each acoustic wave filter 101 is bonded to the second mounting substrate 132B by a plurality of bumps 9 provided on the second surface 104e in the side surface 104c of the piezoelectric layer 104. In each acoustic wave filter 101, one of the plurality of bumps 9 provided on the second surface 104e is connected to an input potential.

Also in the fourth reference example, as in the third reference example, a facing area between terminal portions connected to signal potentials in each acoustic wave filter 101 can be reduced.

In the fourth reference example, the first mounting substrate 132A is connected to the output potential, and the second mounting substrate 132B is connected to the input potential. In this manner, the mounting substrate connected to the input potential and the mounting substrate connected to the output potential are different from each other. Thus, a distance between a terminal of the mounting substrate connected to the input potential and a terminal of the mounting substrate connected to the output potential can be increased. More specifically, in addition to a distance parallel or substantially parallel to a main surface of the first mounting substrate 132A or the second mounting substrate 132B, a distance between terminals can be increased also in a direction in which the main surfaces of the first mounting substrate 132A and the second mounting substrate 132B are linked. Accordingly, it is possible to effectively reduce or prevent propagation of signals between terminals connected to signal potentials. Thus, attenuation characteristics can be effectively improved.

A mounting area of the acoustic wave filter 101 on the main surface of the first mounting substrate 132A is a total of an area of the first surface 104d of the side surface 104c in the piezoelectric layer 104, and an area of the first surface 105d of the side surface 105c in the cover member 105. A mounting area of the acoustic wave filter 101 on the main surface of the second mounting substrate 132B is a total of an area of the second surface 104e in the piezoelectric layer 104, and an area of the second surface 105e in the cover member 105. As described above, mounting areas in a direction parallel or substantially parallel to the main surface of the first mounting substrate 132A or the second mounting substrate 132B can be reduced.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device, comprising:
a mounting substrate including a multilayer body that includes a first layer including a first signal wiring line and a second signal wiring line at least partially facing each other, and a second layer including a ground electrode; and
an acoustic wave filter on the mounting substrate and electrically connected to the first signal wiring line, the second signal wiring line, and the ground electrode; wherein
the ground electrode overlaps the first signal wiring line and the second signal wiring line, and a region between the first signal wiring line and the second signal wiring line in plan view;
a portion of the second layer overlapping the region between the first signal wiring line and the second signal wiring line in plan view includes a ground electrode missing portion;
in plan view, a shape of a portion of the first signal wiring line facing the second signal wiring line includes a longitudinal direction, and a shape of the ground electrode missing portion includes a longitudinal direction; and
the longitudinal direction of the first signal wiring line and the longitudinal direction of the ground electrode missing portion are parallel or substantially parallel to each other.

2. The acoustic wave device according to claim 1, wherein the portion of the second layer overlapping the region between the first signal wiring line and the second signal wiring line in plan view includes a plurality of the ground electrode missing portions.

3. The acoustic wave device according to claim 1, wherein the first signal wiring line includes a missing portion facing portion overlapping the ground electrode missing portion in plan view, and a first adjacent portion and a second adjacent portion located on each side of the missing portion facing portion.

4. The acoustic wave device according to claim 3, wherein a characteristic impedance of the first adjacent portion and a characteristic impedance of the second adjacent portion are lower than a characteristic impedance of the missing portion facing portion.

5. The acoustic wave device according to claim 4, wherein
the first adjacent portion is between a portion of the first signal wiring line connected to the acoustic wave filter, and the missing portion facing portion;
the first signal wiring line includes a filter proximity portion between the portion of the first signal wiring line connected to the acoustic wave filter, and the first adjacent portion; and
$Z2<Z1<Z3$, where $Z1$ is a characteristic impedance of the filter proximity portion, $Z2$ is the characteristic impedance of the first adjacent portion and the characteristic impedance of the second adjacent portion, and $Z3$ is the characteristic impedance of the missing portion facing portion.

6. The acoustic wave device according to claim 5, wherein $n\lambda/2 < L2 \leq 2.5\ L+n\lambda/2$, where L is a length of the missing portion facing portion, L2 is a total length of the first adjacent portion and the second adjacent portion, $\lambda$ is an electrical wavelength in a pass band of the acoustic wave filter, and n is any natural number.

7. The acoustic wave device according to claim 4, wherein widths of the first adjacent portion and the second adjacent portion are greater than a width of the missing portion facing portion.

8. The acoustic wave device according to claim 3, wherein the acoustic wave filter includes a signal terminal electrically connected to the first signal wiring line; and $Z5 < Z4 < Z6$, where Z4 is a mean value of characteristic impedances of the missing portion facing portion, the first adjacent portion and the second adjacent portion, and Z5 and Z6 are a lower limit and an upper limit, respectively, of a range of a real part in a pass band impedance of the acoustic wave filter as viewed from the signal terminal.

9. The acoustic wave device according to claim 1, wherein the acoustic wave filter is a duplexer.

10. The acoustic wave device according to claim 9, wherein the acoustic wave filter is bonded to the mounting substrate by a plurality of bumps.

11. The acoustic wave device according to claim 10, wherein the acoustic wave filter is covered by a sealing resin.

12. The acoustic wave device according to claim 1, wherein each of the first signal wiring line and the second signal wiring line is a micro split line.

13. The acoustic wave device according to claim 1, wherein the ground electrode is provided on a main surface of the second layer.

14. The acoustic wave device according to claim 1, wherein a dimension of a long side of the ground electrode is about 20 mm.

15. The acoustic wave device according to claim 1, wherein a dimension of a short side of the ground electrode is about 0.5 mm.

16. The acoustic wave device according to claim 9, wherein the duplexer includes a transmission filter and a reception filter connected to a common connection terminal.

17. The acoustic wave device according to claim 16, wherein a pass band of the transmission filter is about 880 MHz to about 915 MHz.

18. The acoustic wave device according to claim 16, wherein a pass band of the reception filter is about 925 MHz to about 960 MHz.

19. The acoustic wave device according to claim 16, wherein the transmission filter is a ladder filter.

* * * * *